US012642055B2

(12) United States Patent　　　(10) Patent No.:　US 12,642,055 B2
Burkett　　　　　　　　　　　　 (45) Date of Patent:　May 26, 2026

(54) FEED-FORWARD DEVICE FABRICATION

(71) Applicant: Google LLC, Mountain View, CA (US)

(72) Inventor: Brian James Burkett, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 896 days.

(21) Appl. No.: 17/883,475

(22) Filed: Aug. 8, 2022

(65) Prior Publication Data

US 2024/0047277 A1　　Feb. 8, 2024

(51) Int. Cl.
*H01L 21/66*　　　(2006.01)
*H01L 21/67*　　　(2006.01)
*H10N 60/01*　　　(2023.01)

(52) U.S. Cl.
CPC ........ *H01L 22/12* (2013.01); *H01L 21/67225* (2013.01); *H10N 60/0912* (2023.02)

(58) Field of Classification Search
None
See application file for complete search history.

(56) References Cited

U.S. PATENT DOCUMENTS

| | | | |
|---|---|---|---|
| 6,893,974 B1 | 5/2005 | Sedigh et al. | |
| 2015/0052724 A1 | 2/2015 | Lee | |
| 2016/0060107 A1 | 3/2016 | Herrin et al. | |
| 2019/0137891 A1 | 5/2019 | Brink et al. | |
| 2020/0287120 A1 | 9/2020 | Pikulin et al. | |
| 2024/0047277 A1* | 2/2024 | Burkett ............. | H01L 21/02244 |

FOREIGN PATENT DOCUMENTS

| | | |
|---|---|---|
| JP | H08-124479 | 5/1996 |
| JP | 2006-060021 | 3/2006 |

OTHER PUBLICATIONS

Hertzberg et al., "Laser-annealing Josephson junctions for yielding scaled-up superconducting quantum processors," Quantum Information, Aug. 2021, 7(1):1-8.
Kreikebaum et al., "Improving wafer-scale Josephson junction resistance variation in superconducting quantum coherent circuits," CoRR, Sep. 2019, arxiv.org/abs/1909.09165, 10 pages.
Osman et al., "Simplified Josephson-junction fabrication process for reproducibly high-performance superconducting qubits," Applied Physics Letters, Jan. 2021, 9 pages.
International Search Report and Written Opinion in International Appln. No. PCT/US2023/029736, mailed on Aug. 13, 2024, 16 pages.
International Preliminary Report on Patentability in International Appln. No. PCT/US2023/029736, mailed on Feb. 20, 2025, 8 pages.

\* cited by examiner

*Primary Examiner* — Jack S Chen
(74) *Attorney, Agent, or Firm* — Fish & Richardson P.C.

(57) ABSTRACT

A method includes: forming an opening in a mask layer; measuring a feature size associated with a dimension of the opening; based on the feature size, determining a fabrication parameter; and forming a second layer in the opening. Forming the second layer is based on the fabrication parameter. A fabrication system includes a lithography system; a measurement system; a physical vapor deposition system; an oxidation system; and a control system. The control system is configured to control a feed-forward fabrication process.

16 Claims, 9 Drawing Sheets

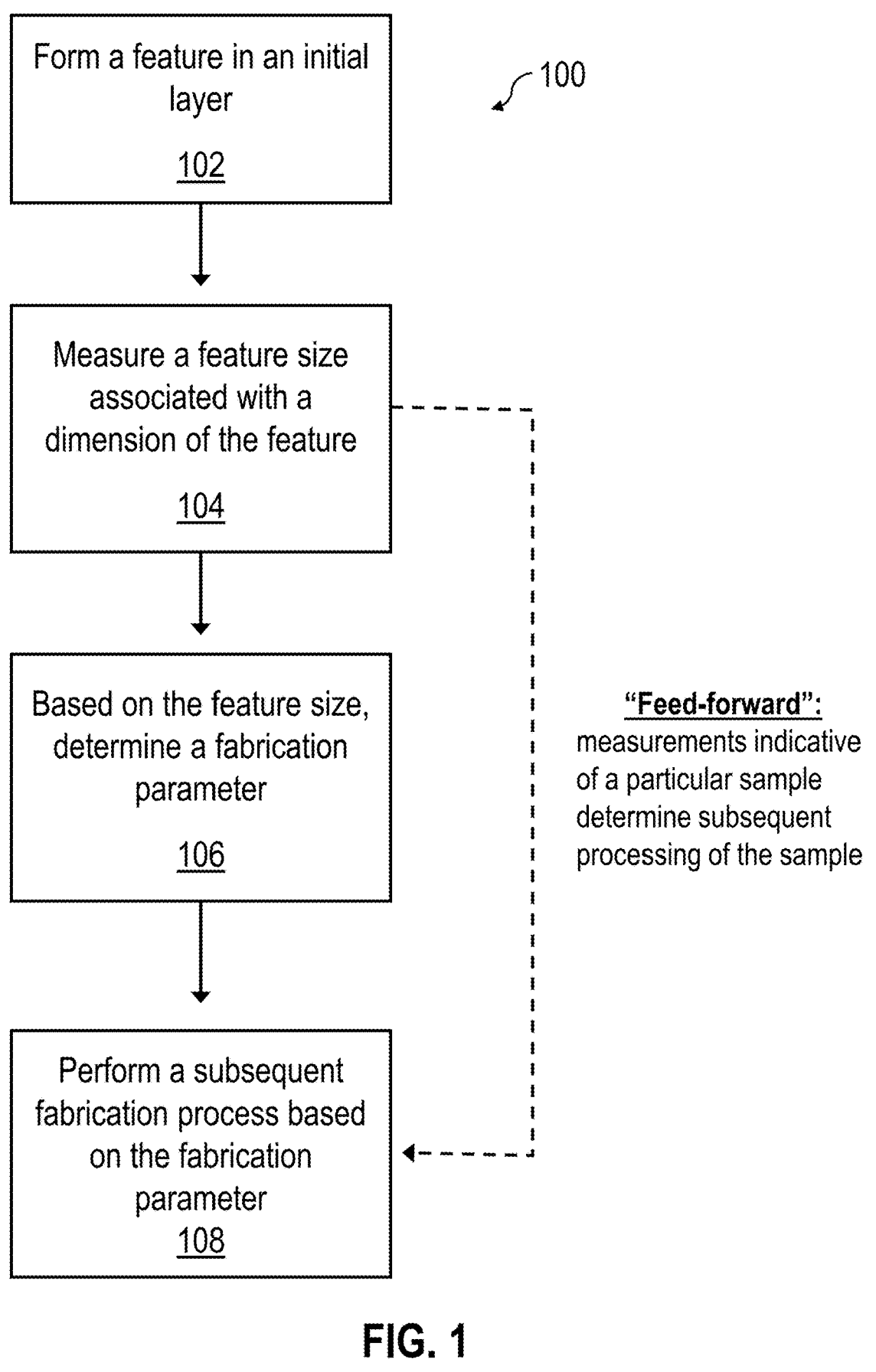

Form a feature in an initial layer

102

Measure a feature size associated with a dimension of the feature

104

Based on the feature size, determine a fabrication parameter

106

Perform a subsequent fabrication process based on the fabrication parameter

108

"Feed-forward": measurements indicative of a particular sample determine subsequent processing of the sample

FIG. 1

- Gas Pressure = $P$
- Exposure time = $t$
- Gas composition
- Other process condition(s)

Oxidation of portion of layer 216

- Deposition time = $T$
- Deposition rate = $r$
- Gas composition
- Gas pressure
- Other process condition(s)

Physical and/or chemical deposition of oxide on layer 216

FEED-FORWARD DEVICE FABRICATION

FIELD OF THE DISCLOSURE

The present disclosure relates to fabrication processes for devices such as qubits.

BACKGROUND

Masking and layer formation processes can be used to define fabricated structures, forming portions of devices for applications such as quantum computing.

SUMMARY

Some aspects of this disclosure describe a fabrication method. According to the fabrication method, an opening is formed in a mask layer. A feature size associated with a dimension of the opening is measured. Based on the feature size, a fabrication parameter is determined. A second layer is formed in the opening. Forming the second layer is based on the fabrication parameter.

This and other disclosed methods can have any one or more of at least the following characteristics.

In some implementations, the second layer includes an oxide layer, and the fabrication parameter includes an oxide growth parameter.

In some implementations, forming the second layer includes: forming a first layer in the opening; and forming the oxide layer on the first layer.

In some implementations, forming the second layer includes growing the oxide layer by oxidizing the first layer based on the oxide growth parameter.

In some implementations, the first layer includes a metal, and the method includes, subsequent to forming the oxide layer, forming a third layer on the oxide layer to form a Josephson junction.

In some implementations, the method includes forming a qubit that includes the Josephson junction.

In some implementations, forming the first layer includes depositing the first layer at a first deposition angle, and forming the third layer includes depositing the third layer at a second deposition angle that is different from the first deposition angle.

In some implementations, the metal includes a superconductor material.

In some implementations, forming the second layer includes exposing a first layer to an oxidizing gas at a partial pressure for a period of time, and the oxide growth parameter includes the partial pressure.

In some implementations, forming the second layer includes exposing a first layer to an oxidizing gas at a partial pressure for a period of time, and the oxide growth parameter includes the period of time.

In some implementations, the method includes forming a circuit element that includes the second layer and a first layer on which the second layer is disposed. Determining the fabrication parameter includes: obtaining a target resonance frequency of the circuit element or a target critical current of the circuit element; determining a junction area based on the measured feature size; and based on the junction area, determining a value for the fabrication parameter that, when applied during formation of the second layer, causes the circuit element to exhibit the target resonance frequency or the target critical current.

In some implementations, determining the fabrication parameter includes: obtaining a target thickness of the second layer that causes the circuit element to have the target resonance frequency or the target critical current; and determining a value of the fabrication parameter that causes the second layer to have the target thickness.

In some implementations, measuring the feature size includes measuring the dimension of the opening.

In some implementations, measuring the feature size includes measuring a dimension of a calibration structure defined by the mask layer. The calibration structure is distinct from the opening.

In some implementations, determining the fabrication parameter includes: determining that the feature size is larger than a predetermined feature size, and, in response to determining that the feature size is larger than the predetermined feature size, selecting the fabrication parameter to cause a thickness of the second layer to be thicker than a first thickness associated with the predetermined feature size; or, determining that the feature size is smaller than the predetermined feature size, and, in response to determining that the feature size is smaller than the predetermined feature size, selecting the fabrication parameter to cause the thickness of the second layer to be thinner than the first thickness associated with the predetermined feature size.

In some implementations, measuring the feature size includes measuring the feature size using atomic force microscopy.

Some aspects of this disclosure describe a fabrication system. The fabrication system includes a lithography system, a measurement system, a physical vapor deposition system, an oxidation system, and a control system. The control system is configured to perform operations that include: causing the lithography system to form an opening in a mask layer; causing the measurement system to measure a feature size associated with a dimension of the opening; based on the feature size, determining an oxide growth parameter; causing the physical vapor deposition system to deposit a first metal layer in the opening; causing the oxidation system to oxidize a portion of the first metal layer based on the oxide growth parameter, to form an oxide layer on the first metal layer; and causing the physical vapor deposition system to deposit a second metal layer on the oxide layer.

This and other disclosed fabrication systems can have any one or more of at least the following characteristics.

In some implementations, causing the oxidation system to oxidize the portion of the first metal layer includes causing the oxidation system to exposure the first metal layer to an oxidizing gas for a period of time, and the oxide growth parameter includes the period of time.

In some implementations, the first metal layer, the oxide layer, and the second metal layer form a Josephson junction when below a critical temperature, and the operations include: obtaining a target resonance frequency of a qubit including the Josephson junction or a target critical current of the Josephson junction; determining a junction area element based on the measured feature size; and, based on the junction area, determining a value for the oxide growth parameter that, when applied during formation of the oxide layer, causes the qubit to exhibit the target resonance frequency or causes the Josephson junction to exhibit the target critical current.

In some implementations, measuring the feature size includes measuring the dimension of the opening, or measuring a dimension of a calibration structure defined by the mask layer. The calibration structure is distinct from the opening.

Implementations according to this disclosure can be used to realize one or more advantages. In some implementations, device performance and yield can be improved by reducing variation in device parameters, compared to devices in which the variation is not compensated for. In some implementations, fabrication of devices can be modified mid-fabrication based on measurement of the devices themselves or of corresponding calibration structures, leading to a reduction in fabrication cost, fabrication complexity, and/or delays associated with feed-back methods or post-fabrication processing. In some implementations, device contamination can be reduced compared to methods that rely on post-fabrication processing.

The details of one or more implementations are set forth in the accompanying drawings and the description below. Other aspects, features and advantages will be apparent from the description and drawings, and from the claims.

BRIEF DESCRIPTION OF THE DRAWINGS

FIG. 1 is a schematic illustrating an example of a fabrication process.

DETAILED DESCRIPTION

This disclosure relates to "feed-forward" fabrication processes. To the extent that typical device fabrication processes are responsive to process variation, drift, and error, the processes are generally "feed-back," meaning that measured results of a process are used to inform subsequent iterations of that process. For example, if a doping process is found to cause higher-than-desired conductivity in a sample, the doping process can be adjusted for future processing so that subsequent samples have lower conductivities. However, in this example of a feed-back process, the sample with the too-high conductivity is not processed differently based on the measured conductivity: either the sample is discarded, or the sample is processed as-usual notwithstanding the measured conductivity. In processes with high levels of variation, this feed-back approach can lead to unacceptably low yields and high costs associated with samples found to be "out of spec."

By contrast, implementations according to this disclosure employ a feed-forward approach to variations in feature sizes of features within existing layers. In particular examples, the feature sizes can relate to sizes of openings, and the existing layers can include, for example, mask layers. Based on a measurement indicative of the feature size in a particular sample, the particular sample is processed differently in subsequent processing steps to compensate for variations in the feature size. Accordingly, variation in device parameters from process-run to process-run can be reduced, and yield can be increased. In some implementations according to this disclosure, the feed-forward approach includes adjustment of an oxide growth parameter, such that a parameter of an oxide (e.g., a thickness of the oxide) is adjusted to compensate for variations in the feature size, e.g., the size of the opening.

Figure 2A:
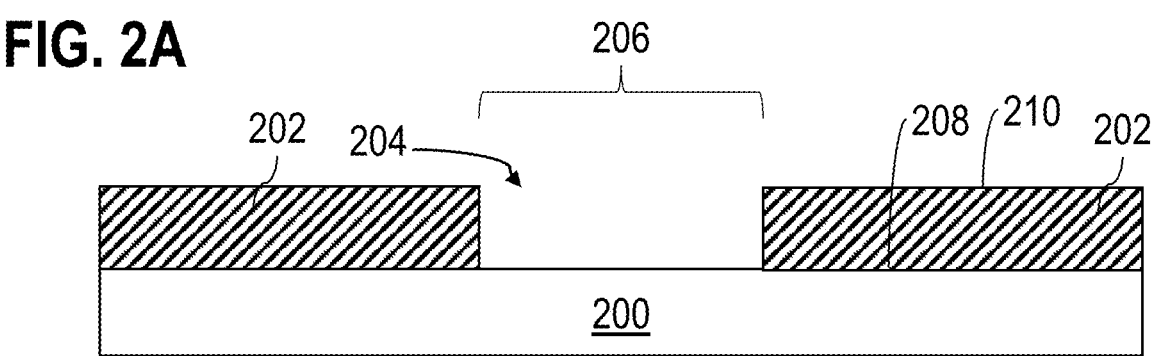
FIGS. 2A-2D are schematics illustrating examples of layer structures.

FIG. 1 illustrates an example of a feed-forward fabrication process 100. In the process 100, a feature is formed in an initial layer (102). For example, the first feature can include an opening, and the initial layer can include a mask layer. For example, as shown in FIG. 2A, an opening 204 is formed in a mask layer 202 disposed on a substrate 200. The mask layer 202 and the substrate 200 can have various compositions in various implementations. In some implementations, the substrate 200 is a semiconductor substrate, such as a silicon substrate. In some implementations, the substrate 200 is a dielectric substrate, such as a glass substrate or a sapphire substrate. In some implementations, the substrate 200 includes multiple materials, such as multiple layers composed of different materials, e.g., a silicon oxide layer on an underlying silicon substrate. In some implementations, the mask layer 202 is or includes a photoresist layer, and forming the opening 204 can include performing photolithography (e.g., masked exposure followed by development) on the mask layer 202. In some implementations, the mask layer 202 is or includes a "hard mask" layer, e.g., an oxide or other dielectric layer (such as a thermal oxide layer, a chemical vapor-deposited oxide layer, or a nitride layer), a metal layer, a semiconductor layer (such as a chemical vapor-deposited polysilicon layer), an organic layer (such as a plastic layer or a polymer layer, e.g., a poly(methyl methacrylate) (PMMA) layer) or a combination of these types of layers. For example, in some implementations the mask layer 202 includes a semiconductor layer disposed on an oxide layer, an oxide layer disposed on a metal layer (e.g., a niobium oxide layer disposed on a niobium layer), or an organic layer disposed on one or more layers. In some implementations, the mask layer 202 includes a suspended portion, e.g., for use in a Dolan-type fabrication process. In some implementations, the opening 204 in the mask layer 202 includes an undercut.

Other types of features can include, for example, ridges, trenches, bumps, protrusions, pads, and/or cylinders (e.g., in a cylinder array), formed in or defined by the initial layer.

Forming the feature in the initial layer can include one or more of a variety of processes. For example, forming the feature can include forming the opening 204 in the mask layer 202, such as by masked deposition of the mask layer 202 (e.g., evaporation through a shadow mask), photolithography, and/or etching.

Formation of the feature in the initial layer is subject to variations that cannot be predicted in advance. For example, a dimension of the feature (e.g., a dimension 206 of the opening 204), such as a radius, diameter, depth, height, width, and/or length of the feature, can vary by 5%, 10%, 20%, or more. Variation in the dimension 206 can be associated with variation in processing environment (e.g., temperature and/or humidity), variation in a location of the opening 204 (e.g., a location of the opening 204 on the substrate 200 and/or a location of the opening 204 with respect to a sample processing system, such as a location of the opening 204 on a platen or chuck of a deposition or etching system), variation in a chemical concentration/composition, variation in exposure of photoresist (such as some implementations of the mask layer 202), e.g., overdosing/underdosing, variation in photoresist development, and/or another type of process variation. Process variation can be worsened for features with high aspect ratios, e.g., high ratios of a thickness of the mask layer 202 to the dimension 206 for opening 204. High aspect ratios can occur, for example, in the context of double-angle deposition processes in which sidewalls of the opening (defined by the thickness of the mask layer) are used to shadow physical vapor deposition of a layer in opening. Lithography processes that typically exhibit low variation may exhibit, in some cases, higher variation when used to fabricate openings with high aspect ratios.

Referring back to FIG. 1, in the process 100, a feature size associated with a dimension of the feature is measured (104). For example, in some implementations the dimension itself, such as dimension 206 of the opening 204, is measured. For example, the dimension 206 may be a diameter of a circular opening 204, or the dimension 206 may be a side length of a square or rectangular opening 204. In some implementations, multiple feature sizes are measured, e.g., multiple feature sizes associated with multiple different axes. In some implementations, the feature size is associated with an area of the opening 204. For example, the area of the opening 204 can scale positively with the dimension of the opening 204.

Figure 4:
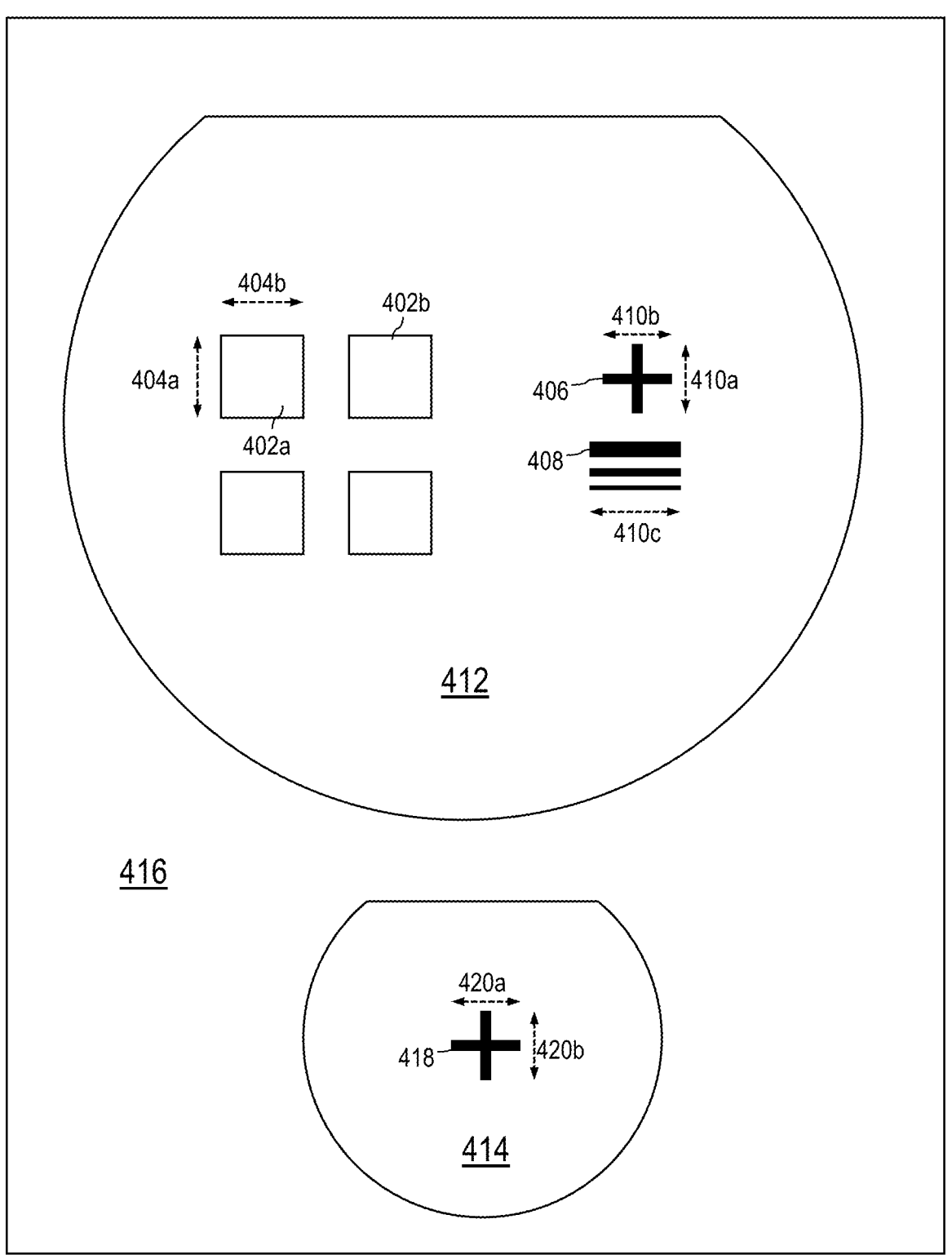
FIG. 4 is a schematic illustrating examples of openings and calibration structures.

The measured element (sometimes referred to as a feature) whose size is associated with the dimension of the feature may be an element of the feature itself (e.g., dimension 206 of opening 204), an element distinct from the feature and located on a same substrate as the feature, or an element located on a separate substrate. For example, as shown in FIG. 4, openings 402a, 402b are formed on a sample 412. One or more layers will be deposited in the openings 402a, 402b, e.g., to form at least a portion of a device/junction. In some implementations, dimensions 404a and/or 404b of the openings 402a, 402b (e.g., side lengths) are measured. For example, the area of opening 402a (a rectangle) is dimension 404a times dimension 404b. In some implementations, features indicative of orthogonal dimensions are measured, e.g., dimensions 404a and 404b corresponding to orthogonal sides of opening 402a. Feature size variation may not be identical for features oriented in different dimensions. For example, a width of an opening may be 10% larger than a target width, while a length of the opening may be 5% larger than a target length. By measurement of features oriented in different directions/along different axes, axis-dependent size variations can be detected.

In some implementations, the measured element(s) are measured in a lateral direction, e.g., a direction parallel to a surface 208 of the substrate 200 and/or a surface 210 of the mask layer 202. These lateral dimensions can be associated with areas of features, such as an area of the opening 204 and, accordingly, with an area of one or more layers subsequently formed in the opening 204. In some implementations, the measured element(s) are measured in a vertical direction, e.g., a direction perpendicular to the surface 208 of the substrate 200 and/or a surface 210 of the mask layer 202. Perpendicular, non-lateral dimensions may be associated with a thickness of the mask layer 202 and a thickness of one or more layers subsequently formed in the opening 204.

In some implementations, an element distinct from the feature in the initial layer is measured, where a size of the element is nevertheless associated with a dimension of the feature. For example, dimensions of a different feature can be measured. For example, as shown in FIG. 4, dimensions 404a, 404b of opening 402a can be measured, and the dimensions 404a, 404b can be indicative of corresponding dimensions of opening 402b, e.g., based on an assumption that variations in opening dimensions will tend to be similar or identical across different openings of the same sample.

The dimensions 404a, 404b of opening 402a can be indicative of an area of the opening 402b based on their association with the corresponding dimensions of the opening 402b. The opening 402b can be formed in the same fabrication process as opening 402a (e.g., using common lithography steps), such that variations in dimensions of the openings 402a and 402b can be expected to be similar or identical.

In some implementations, one or more calibration features can be formed on the same sample as the feature in the initial layer. For example, calibration features 406, 408 can be formed on the same sample 412 as the openings 402a, 402b. For example, the calibration features 406, 408 can be disposed on the same substrate as the mask layer that defines the openings 402a, 402b. In some implementations, the calibration features 406, 408 include and/or are defined by the same mask layer that defines the openings 402a, 402b. For example, the openings 402a, 402b can be openings in a photoresist mask layer, and the calibration features 406, 408 can include openings in the photoresist mask layer and/or patterned features of the photoresist mask layer. In some implementations, the calibration features 406, 408 can be formed at least partially in the same fabrication process as openings 402a, 402b (e.g., using common lithography steps), such that variations in dimensions of the openings 402a, 402b can be expected to be similar to (e.g., proportional to) variations in dimensions of the calibration features 406a, 406b. For example, a lithography mask that includes features to define the openings 402a, 402b in a mask layer can also include features to define the calibration features 406, 408 in the mask layer. The calibration features 406, 408 can have any suitable geometry, such as crosses, ridges, pillars, and/or defined openings (such as valleys/troughs).

In some implementations, one or more dimensions 410a, 410b of the calibration features 406, 408 are measured. For example, one or more widths, lengths, diameters, depth, and/or radii of the calibration features 406, 408 can be measured. Because the calibration features 406, 408 are provided on the same sample 412 as the openings 402a, 402b, are defined in or by the same mask layer that defines the openings 402a, 402b, and/or are formed at least partially in the same fabrication process as the openings 402a, 402b, variations in the dimensions 410a, 410b, 410c of the calibration features 406, 408 are associated with variations in dimensions 404a, 404b of the openings 402a, 402b. For example, in some implementations, variations in dimensions of the calibration features 406, 408 are proportional to variations in dimensions of the openings 402a, 402b, such as in the same direction. For example, because dimension 410a is parallel to dimension 404a, based on a measurement of dimension 410a, dimension 404a can be determined.

For example, if dimension 410a has a nominal value (e.g., an expected value, a target value, an average value, or other standard value) $L_{1,a}$ and a measured, actual value of $L_{1,a} + \Delta L_{1,a}$, and dimension 404a has a nominal value $L_{2,a}$, it can be determined that dimension 404a has an actual value of $L_{2,a} + c_a \Delta L_{1,a}$, where $c_a$ is a proportionality constant. $c_a$ can be based on one or more of relative positions of opening 402a and calibration feature 406 (e.g., a distance between opening 402a and calibration feature 406), positions of the opening 402a and/or the calibration feature 406 on the sample 412 and/or with respect to a sample processing system, and/or another parameter. For example, a smaller distance between opening 402a and calibration feature 406 can be associated with a value of $c_a$ closer to 1, while $c_a$ can scale to be further from 1 (e.g., positive and closer to 0, or larger than 1) for further distances between opening 402a and calibration feature 406. In some implementations, an analogous relationship $L_{2,b}+c_b\Delta L_{1,b}$ can provide an actual value of dimension 404b based on a measurement of dimension 410b or dimension 410c, where $c_b$ can be the same as or different from $c_a$. Based on the inferred or measured actual values of dimensions 404a and 404b, an area of opening 402a can be determined, e.g., by multiplication of the dimensions 404a and 404b, or another suitable operation.

The foregoing mathematical relationship is an example. Other proportionalities, equations, algorithms, and relationships between measured sizes/dimensions and corresponding opening dimensions/areas are within the scope of this disclosure.

In some implementations, a measured calibration feature is disposed on a separate sample from that having the feature in the initial layer. For example, as shown in FIG. 4, a platen 416 holds sample 412 and separate sample 414, e.g., a separate wafer or other substrate. For example, the platen 416 can be a platen of a sample processing system, and a calibration feature 418 on the separate sample 414 can be formed at least partially in the same fabrication process as openings 402a, 402b. One or more dimensions 420a, 420b of the calibration feature 418 can be measured, based on which dimensions of the openings 402a, 402b (associated with areas of the openings 402a, 402b) can be determined. For example, one or more of the dimensions 420a, 420b can be related to dimensions of the openings 402a, 402b according to a predetermined relationship.

The measurement of a separate calibration feature instead of, or in addition to, measurement of features themselves, can be advantageous in some implementations. For example, the separate calibration feature can have a structure (e.g., shape and/or size) configured for accurate and efficient measurement, while the structure of the features (e.g., openings) may be configured based on properties of devices fabricated using the features, which may lead to less accurate measurement. In addition, in some implementations, measurement may introduce contamination into measured features, cause distortion or destruction of measured features, etc., which may alter the properties of devices fabricated using features such as openings. By measurement of calibration features, the features used for device fabrication can be left pristine.

Measurement can be conducted using any suitable measurement technique or combination of techniques. In some implementations, the measurement includes optical microscopy, such as confocal microscopy. In some implementations, the measurement includes non-optical microscopy, such as electron microscopy (e.g., scanning electron microscopy or tunneling electron microscopy). In some implementations, the measurement includes physical measurement, such as atomic force microscopy or profilometry. In some implementations, the measurement has a spatial resolution of 1 nm, 5 nm, or another value less than 10 nm, resolutions provided by some implementations of atomic force microscopy. In some implementations, atomic force microscopy is effective for measurement of dimensions of narrow openings in the mask layer 202, because the atomic force microscopy tip is sufficiently small to fit into the narrow openings, which may measure about 100 nm across. In some implementations, the measurement is performed in situ, e.g., within a chamber in which the first layer is formed and/or in which the second layer is formed (such as a physical vapor deposition chamber and/or an oxidation chamber).

Referring back to FIG. 1, based on the one or more measured feature sizes, one or more fabrication parameters are determined (106). For example, a stored relationship (e.g., an algorithm or a machine learning model) can relate one or more fabrication parameters to one or more measured feature sizes. The relationship can be stored in a storage of a computing system.

Figure 2B:
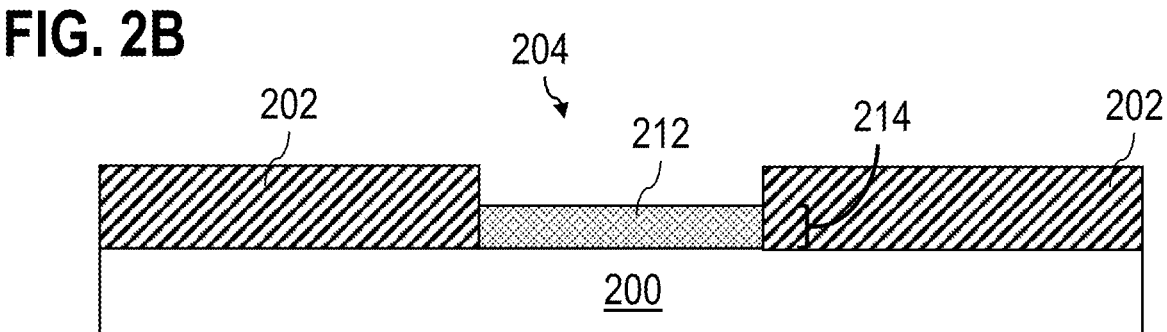

The fabrication parameter is an adjustable parameter of a fabrication process that is performed based on the fabrication parameter (108). For example, one or more layers can be formed based on the fabrication parameter, one or more features can be formed based on the fabrication parameter, one or more subtractive processes, such as etching, can be performed based on the fabrication parameter, and/or one or more modifying fabrication processes can be performed based on the fabrication parameter. As shown in FIG. 2B, in some implementations, a second layer 212 is formed in the opening 204 based on the fabrication parameter. For example, when the second layer 212 is deposited by physical vapor deposition (e.g., thermal evaporation or sputtering), the fabrication parameter can be a deposition duration and/or deposition rate, which together determine a thickness 214 of the second layer 212. Other examples of fabrication parameters include a temperature (e.g., a temperature of the substrate 200 or a chamber temperature during formation of the second layer 212), a pressure (e.g., a chamber pressure during formation of the second layer 212), a gaseous mix associated with formation of the second layer 212 (e.g., relative proportions of different gases, such as a precursor gas and an oxidizer gas), and/or a spin rate. The second layer 212 can be formed by physical vapor deposition, chemical deposition (e.g., chemical vapor deposition, such as plasma-enhanced chemical vapor deposition or atomic layer deposition), spin deposition, or another suitable layer formation process.

In some implementations, one or more features can be formed based on the fabrication parameter. The features can include, for example, ridges, trenches, bumps, protrusions, pads, and/or cylinders (e.g., in a cylinder array).

The fabrication parameter need not be associated with additive fabrication, such as layer formation. For example, in some implementations the fabrication parameter can be associated with a subtractive fabrication operation and/or a modifying fabrication operation. Subtractive fabrication can include, for example, etching or lithography (which can include an etching process). For example, instead of or in addition to deposition of the second layer 212 in the opening 204, processing can be performed to etch the substrate 200 in the opening 204, e.g., to increase a depth of the opening 204 or to form an etched feature (e.g., a trench) in the opening 204. Processing instead or additionally can be performed to remove or pattern the initial layer, e.g., to form further features in the initial layer. Fabrication parameters for subtractive processing can include, for example, lithography parameters (e.g., exposure doses or development chemistries/times, resist type and deposition parameters, selections of geometries for patterned features, etc.) and/or etching parameters (e.g., etchant chemistry, such as gas composition for plasma etching or a liquid composition for wet chemical etching, an etching duration, or other etching parameters, such as power for plasma etching). For example, openings can be formed in the initial layer, where one or more dimensions/shapes of the openings, and/or one or more parameters for forming the openings, are determined based on the measured feature size. A modifying fabrication operation can include, for example, oxidation, annealing, or chemical treatment (e.g., by exposure to a gas or a liquid). Fabrication parameters for a modifying fabrication operation can include, for example, temperature, duration (e.g., a time for which the sample is annealed), and/or a chemical composition (e.g., gas mix or a liquid solution) to which the sample (e.g., the initial layer) is exposed.

The fabrication parameter can be determined so that the fabrication parameter, in conjunction with one or more dimensions of the feature associated with the measured feature size, causes one or more formed layers, devices, or structures to have one or more target characteristics. For example, the fabrication parameter can cause one or more structures (which can include one or more additional layers formed based on the fabrication parameter, one or more structures formed in the initial layer and/or the substrate based on the fabrication parameter, and/or one or more structures modified based on the fabrication parameter) to have desired morphological, chemical, electrical, and/or optical characteristics.

For example, the fabrication parameter can cause the second layer, formed in the opening of the mask layer, to have one or more target characteristics, and/or cause a device including the second layer to have one or more target characteristics. For example, the fabrication parameter can be selected so that the second layer 212 has a target thickness 214, a target density, a target composition, a target optical property (e.g., a target refractive index), a target electrical property (e.g., a target conductivity), and/or another target parameter.

In an example relating to FIG. 2B, the second layer 212 can be a resistive layer of a resistor having resistance $R=\rho t/A$, where $\rho$ is a resistivity of the second layer 212, t is the thickness 214 of the second layer, and A is a cross-sectional area of the second layer 212, which is defined by the area of the opening 204 (e.g., determined at least in part by dimension 206 of the opening 204). A target resistance of the resistor is $R_0$. Accordingly, when A is determined by measurement of the dimension 206 and/or measurement of a size of one or more other features, a fabrication parameter for forming the second layer 212 (e.g., deposition duration) can be selected to cause the thickness 214 to be $R_0 \times A/\rho$, so that the target resistance $R_0$ is achieved. In some implementations, fabrication parameter determination is performed based on variations from target values. For example, the target resistance $R_0$ can be associated with a target thickness $t_0$ and a target area $A_0$. In response to a determination that the actual area is 1.1 $A_0$ (corresponding to a 10% deviation in fabricated area), the one or more fabrication parameters can be selected so that the formed thickness 214 is 1.1 $t_0$, to achieve the target resistance. As another example related to resistance, instead of or in addition to selection of a fabrication parameter to set the thickness 214, a fabrication parameter (e.g., deposition rate or substrate temperature during deposition, such as to control a crystallinity of the second layer 212) can be selected to set a resistivity p that provides the target resistance.

The second layer 212 can be composed of any material or combination of materials that provide a desired characteristic or functionality to the second layer 212 and/or a device including the second layer 212. For example, the second layer 212 can be a metal layer, a dielectric layer (such as an oxide layer or nitride layer), a semiconductor layer, and/or an organic layer.

Figure 2C:
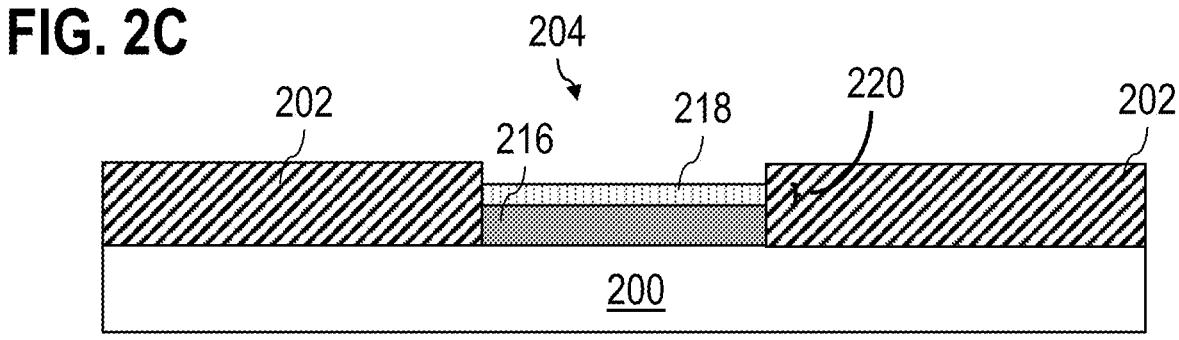

FIG. 2C illustrates an example in which two layers are formed in the opening 204. A first layer 216 is formed on the substrate 200, and a second layer 218 is formed on the first layer 216. Fabrication parameters for formation of one or both of the first and second layers 216, 218 can be determined based on the feature size. For example, in some implementations, a fabrication parameter that sets a thickness 220 of the second layer 218 is determined based on the feature size. The first and second layers 216, 218 can be composed of any combination of material types as described above for the second layer 212. In some implementations, areas of the first and/or second layers 216, 218 are set by (e.g., are equal to or have a predetermined relationship with) an area of the opening 204.

Figure 3A:
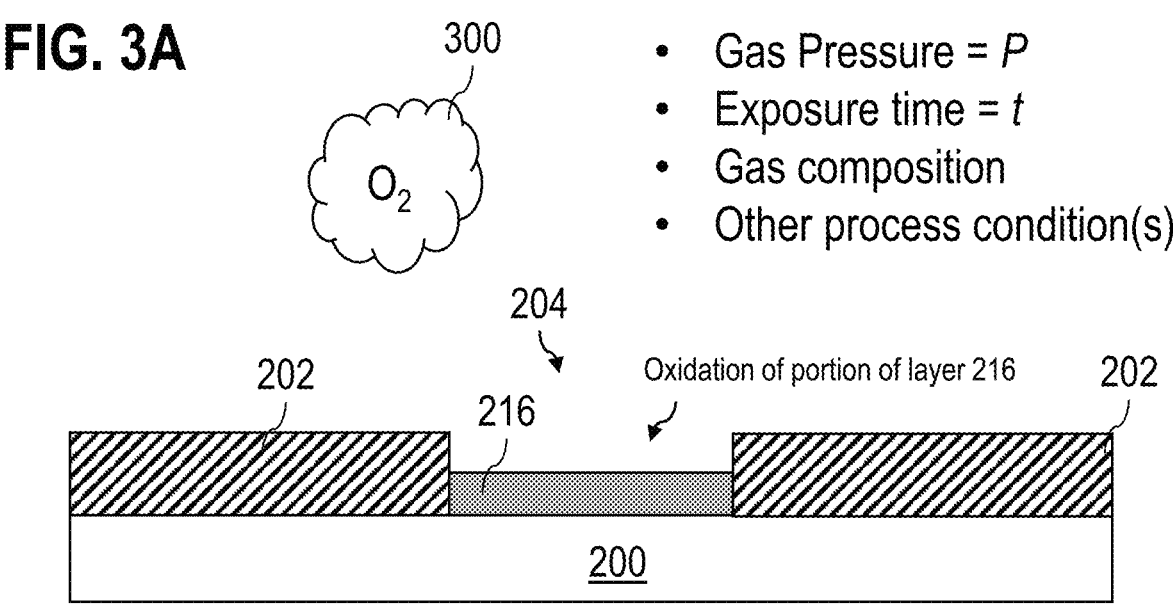
FIGS. 3A-3B are schematics illustrating examples of oxide growth.

FIG. 3A illustrates an example of forming an oxide layer as the second layer 218 on the first layer 216. In this example, the second layer 218 is an oxide formed by oxidizing a portion of the first layer 216, such that the second layer 218 is formed on a remaining portion of the first layer 216. To oxidize the first layer 216, an oxidizing gas 300 (such as oxygen, ozone, hydrogen peroxide, and/or water vapor) is provided into a sample chamber that holds the substrate 200 and layers thereon. For example, the oxidizing gas 300 can be provided at a partial pressure P for an exposure time t, where P and t scale positively with increased thickness 220 of the second layer 218. In some implementations, the substrate 200 is heated to a predetermined temperature range during exposure to the oxidizing gas 300. In some implementations, the one or more fabrication parameters determined based on the feature size include one or more of the partial pressure P of the oxidizing gas 300, the exposure time t, a composition of the oxidizing gas 300 (e.g., a selection of a single gas, or relative concentrations of multiple gases), an overall (non-partial) pressure during oxidation, or another parameter, such as a temperature of the substrate 200 during oxidation. Configuration of these and/or other fabrication parameters can determine a thickness of the oxide formed on the first layer 216.

In some implementations, the first layer 216 is a metal, and the second layer 218 is a metal oxide of the metal. For example, the first layer 216 can be aluminum, and the second layer 218 can be aluminum oxide. As another example, the first layer 216 can be niobium, and the second layer 218 can be niobium oxide. As another example, the first layer 216 can be tantalum, and the second layer 218 can be tantalum oxide. In some implementations, the first layer 216 is a metal that exhibits superconductivity at low temperatures, such as described in further detail with respect to FIG. 2D. In some implementations, the exposure time t is on the order of minutes or tens of minutes, such as between ten minutes and one hour. In some implementations, the partial pressure P is on the order of tens of mTorr, such between 10 mTorr and 100 mTorr. Other suitable pressures and exposure times are also within the scope of this disclosure.

Figure 3B:
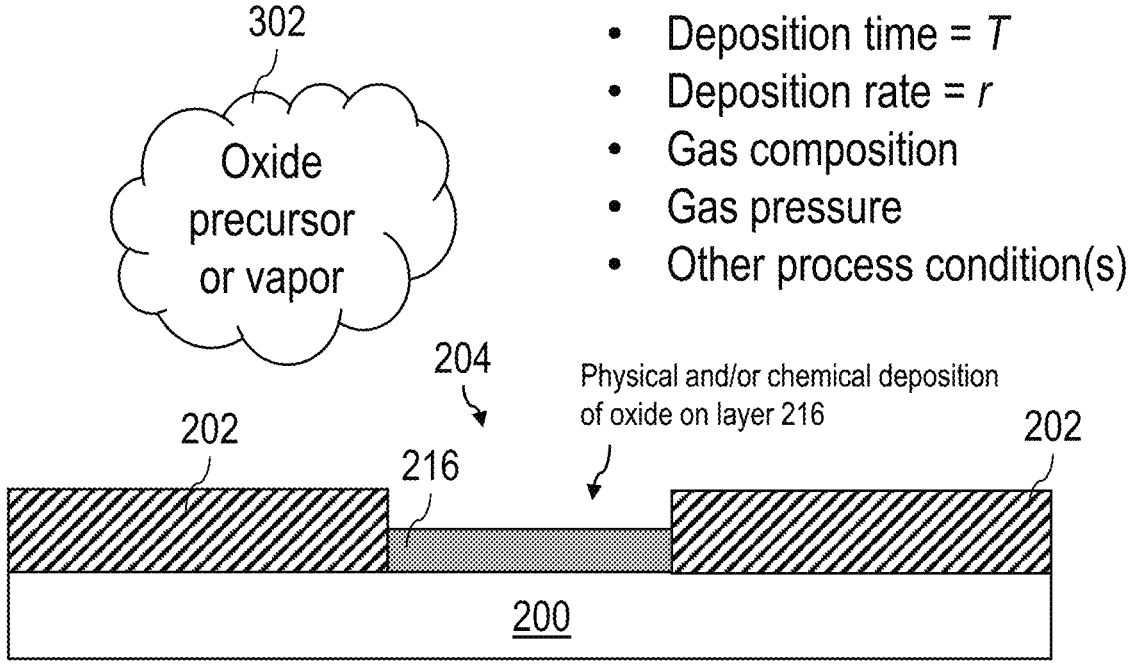

FIG. 3B illustrates another example of forming an oxide layer as the second layer 218 on the first layer 216. In this example, the second layer 218 is formed by physical and/or chemical deposition. For example, an oxide layer as the second layer 218 can be deposited using atomic layer deposition (ALD) or sputtering. In the case of a chemical deposition process, a precursor gas 302 of the second layer 218 is provided into the sample chamber, such as an organometallic compound (e.g., trimethylaluminum). In the case of a physical vapor deposition process, vapor 302 (projected source material) is present in the sample chamber, in some implementations together with an oxidizing gas. Fabrication parameter(s) that can be determined based on the feature size include a deposition time T, a deposition rate r (e.g., relating to a sputtering power or thermal evaporation heating power), a gas composition (e.g., for chemical vapor deposition or sputtering oxidation), a gas pressure, or another parameter, such as a temperature of the substrate 200 during deposition of the second layer 218.

Figure 2D:
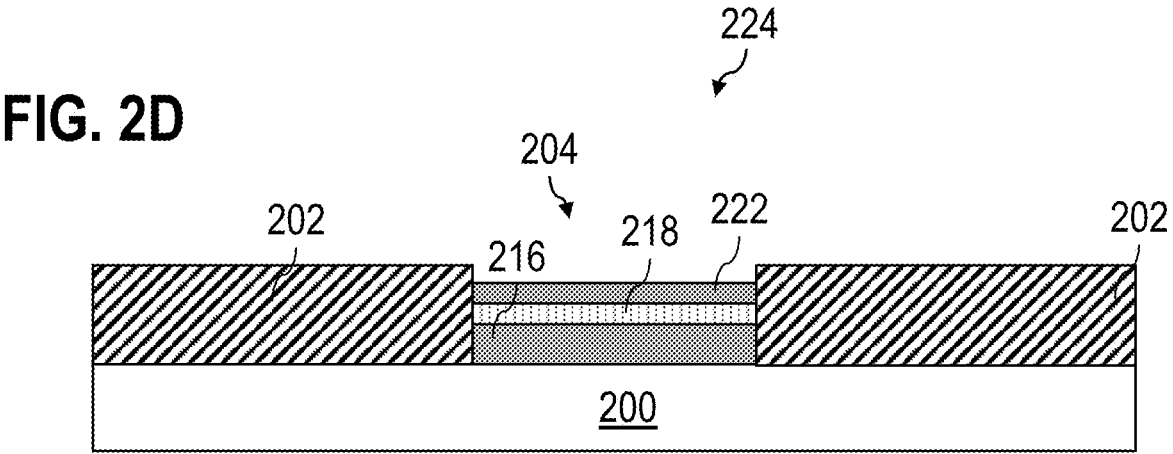

In some implementations in which a second layer 218 is formed on a first layer 216, a third layer is formed on the second layer 218. For example, as shown in FIG. 2D, a third layer 222 is formed on the second layer 222. When the third layer 222 is included, the first, second, and third layers 216, 218, 222 can be composed of any combination of material types as described above for the second layer 212. In some implementations, the third layer 222 is composed of the same material or combination of materials as the first layer 216. In some implementations, the area of the third layer 222 is set by (e.g., is equal to or has a predetermined relationship with) the area of the opening 204. The third layer 222 can be formed by any suitable fabrication method, including oxidation of the second layer 218, physical vapor deposition, and/or chemical deposition. In some implementations, one or more fabrication parameters for formation of the third layer 222 are determined based on one or more measured feature sizes.

In some implementations, the second layer 218 is a thin insulating layer (e.g., a dielectric layer), such as an oxide layer or a nitride layer, and the first and third layers 216, 222 are composed of one or more materials that have a superconducting critical temperature $T_C$, such that the first, second, and third layers 216, 218, 222 form a Josephson junction 224 when the layers are lowered to below $T_C$. Materials that become superconducting at low temperatures can be referred to as "superconductor materials." In some implementations, the first layer 216 is a superconductor metal; the second layer 218 is an oxide layer formed by oxidizing a portion of the first layer 216 as described in reference to FIG. 3A, so that the second layer 218 is an oxide of the superconductor metal; and the third layer 222 is another superconductor metal, such as the superconductor metal of the first layer 216. For example, the first and third layers 216, 222 can be composed of aluminum, and the second layer 218 can be composed of aluminum oxide. As another example, the first layer 216 can be composed of aluminum, the second layer 218 can be composed of aluminum oxide (e.g., grown aluminum oxide), and the third layer 222 can be composed of a superconductor material besides aluminum. As another example, the first and third layers 216, 222 can be composed of niobium, and the second layer 218 can be composed of niobium oxide. As another example, the first and third layers 216, 222 can be composed of tantalum, and the second layer 218 can be composed of tantalum oxide.

Other materials and combinations of Josephson junction materials are also within the scope of this disclosure. For example, some implementations of the first, second, and third layers 216, 218, 222 that form a Josephson junction are different from a metal-oxide-metal structure. For example, in some implementations the second layer 218 is a nitride (e.g., silicon nitride) or a semiconductor (e.g., InAs).

For clarity, FIGS. 2B-D illustrates layers 212, 216, 218, and 222 in the opening 204 and not elsewhere. However, in some cases, these layers 212 may be formed elsewhere in addition to in the opening 204. For example, a physical vapor deposition process can cause the first layer 216 to be deposited not only in the opening 204 but also onto the mask layer 202. In some implementations, a liftoff or etching process can be used to remove other portions of the layers 212, 216, 218, and 222. For example, at least a portion of the mask layer 202 can be removed to lift off portions of the layers 212, 216, 218, and 222 that are formed on the mask layer 202.

In some implementations in which the first, second, and third layers 216, 218, and 222 form a Josephson junction, one or more fabrication parameters are determined so as to set one or more parameters of the Josephson junction and/or a device including the Josephson junction to target values. When the first and third layers 216, 222 are composed of the same superconductor material (e.g., aluminum metal), the critical current of the Josephson junction is $$I_c = \frac{\pi \Delta}{2 e R_n},$$

where $\Delta$ is the superconducting gap energy and $R_n$ is the normal-state resistance of the Josephson junction. $R_n$ is related to parameters of the second layer 218 by $R_n \propto t/A$, where t is the thickness 220 of the second layer 218 and the A is the junction area, which is set by the area of the opening 204 and thus associated with lateral dimensions of the opening 204 and lateral dimensions of any calibration features.

For a transmon qubit including a Josephson junction (discussed in more detail with respect to FIG. 6B), the fundamental transition (resonance) frequency $$f_{01} = \frac{1}{2\pi\sqrt{LC}} - \frac{E_C}{h},$$

where C is the qubit capacitance and $E_C$ is the qubit charging energy $$E_C = \frac{e^2}{2C}.$$

L is the Josephson inductance $$L = \frac{\Phi_0}{2\pi I_C},$$

where $\Phi_0$ is the magnetic flux quantum $$\Phi_0 = \frac{h}{2e}.$$

Accordingly, variation in $R_n$ can cause variation in transmon frequency by the dependence of $f_{01}$ on $I_C$. In some cases, variation in $R_n$ is the dominant source of variation in $f_{01}$. $f_{01}$ itself can be an important parameter for design and operation of the qubit. Accordingly, reducing variation in $R_n$ can provide improved qubit performance by providing a target value of $f_{01}$ more reliably. For example, variations in $f_{01}$ or other qubit parameters can cause undesired qubit state transitions, qubit state leakage, and/or other effects associated with poor qubit performance.

To obtain this improved qubit reliability, in some implementations the one or more fabrication parameters are determined for formation of the second layer 218 to provide a target value for a qubit parameter of a qubit including a Josephson junction formed by the first, second, and third layers 216, 218, 222. For example, the qubit can be a transmon qubit, and the target value can be a target value of qubit parameters $R_n$, $I_C$, L, or $f_{01}$. In some implementations, the target value can be a target value of qubit parameters $E_C$ (charging energy) or $E_J$ (Josephson energy). Based on a measured feature size, a fabrication parameter is determined that will form the second layer 218 so that the target $R_n$, $I_C$, L, or $f_{01}$ is achieved. For example, when the measured feature size is less than a target value (indicating a too-wide opening 204 caused by fabrication variation), A is also less than a target value, and, accordingly, an exposure time for forming the second layer 218 can be reduced from a standard value to form a thinner second layer 218 (smaller value of t), so that $R_n \propto t/A$ is maintained at a target value that provides a target value of $f_{01}$. The exposure time can be determined based on a stored relationship between measured feature sizes and corresponding exposure times.

In some implementations, feed-forward processes that modify a fabrication parameter for subsequent processing (e.g., for forming one or more of the first, second, and third layers 216, 218, 222) can be more effective than processes that modify already-formed structures ("post-fabrication processing") to achieve target parameter values (e.g., target qubit parameters). First, post-fabrication processing can be associated with increased cost, process complexity, and/or sample contamination, compared to some implementations described herein, because the post-fabrication processing introduces one or more additional steps. By contrast, some implementations of the feed-forward processes described herein modify fabrication parameters of existing fabrication steps without adding additional steps, maintaining overall process efficiency. In addition, some post-fabrication processing can be limited to modifying structures so that parameter values are shifted in only one direction. For example, if $f_{01}$ for a qubit is lower than a target value, one or more already-formed layers of the qubit can be modified so that $f_{01}$ is set to the target value; however, if $f_{01}$ is higher than the target value, post-fabrication processing to reduce the frequency may not be feasible, given available methods. By contrast, some feed-forward processing implementations of this disclosure, such as exposure time modification for oxidation to form the second layer 218, can adjust parameter values up or down, for increased flexibility in reducing parameter variation.

Figure 5A:
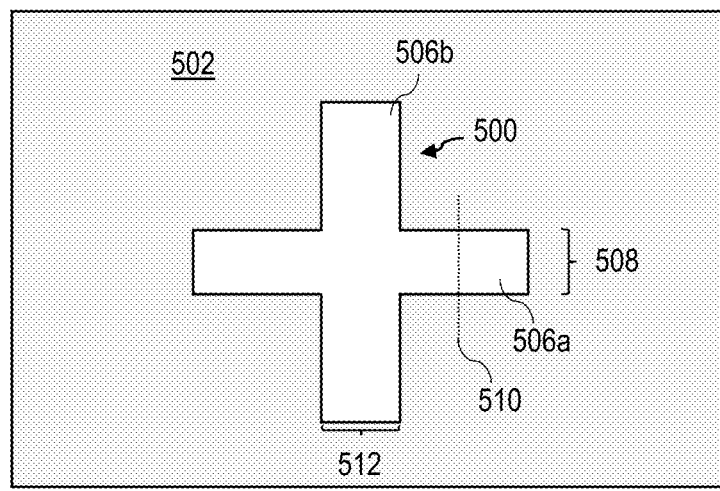
FIGS. 5A-5D are schematics illustrating an example of a fabrication process.
Figure 5B:
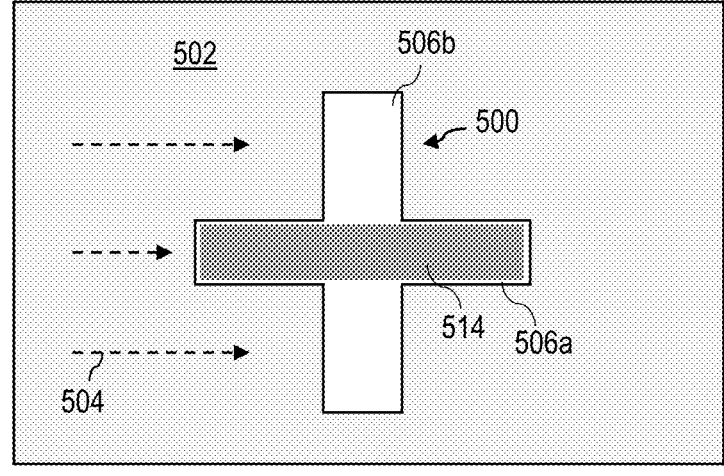
Figure 5C:
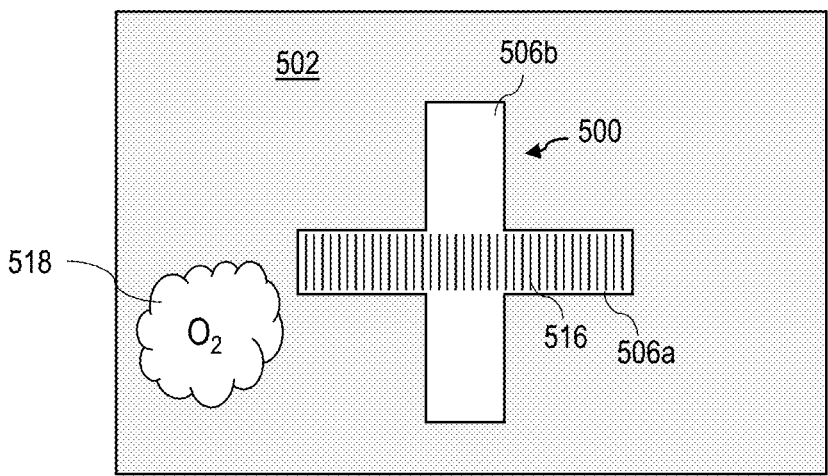

FIGS. 5A-5C illustrate an example of a double-angle deposition process that can be used to fabricate junctions such as Josephson junctions. As shown in FIG. 5A, an opening 500 is defined in a photoresist mask layer 502. The opening 500 includes two intersecting portions: a first opening portion 506a and a second opening portion 506. The opening 500 can be defined in the photoresist mask layer 502 by photolithography or electron-beam lithography.

The first opening portion 506 has a width 508. In a measurement process, the width 508 is measured directly, and/or a width of a calibration feature is measured, where the width of the calibration feature is indicative of the width 508. For example, a probe of an atomic force microscope can be scanned along a line 510 to determine the width 508, and/or the probe can be scanned on a calibration feature, along a line parallel to the line 510, to obtain a feature size based on which the width 508 can be inferred. In some implementation, an analogous process (e.g., direct measurement of the width 512 and/or measurement of a corresponding dimension of a calibration feature) can be used to determine a width 512 of the second opening portion 506b. In some implementations, the width 512 is determined based on the same measurement(s) based on which the width 508 is determined, e.g., a variation of the width 512 from a nominal value can be determined to be the same as or proportional to a variation of the width 508 from a nominal value.

In some implementations, the opening 500 is cleaned before and/or after measurement. For example, a plasma clean process (e.g., a "descum" oxygen plasma clean) can be performed before and/or after the measurement. When a clean is performed after measurement, in some implementations the clean can at least partially remove contamination associated with the measurement.

As shown in FIG. 5B, a first layer 514 (e.g., first layer 216) is deposited in the opening 500 by physical vapor deposition conducted at a first deposition angle, indicated by deposition direction 504. Because of an aspect ratio of the opening 500 (e.g., because of a high ratio of a height of the photoresist sidewalls of the opening 500 to width 512), the first layer 514 is deposited in the first opening portion 506a and not in the second opening portion 506b (except for intersection areas of the two opening portions 506a, 506b). For example, the first layer 514 can be a metal superconductor material, such as aluminum or niobium.

As shown in FIG. 5C, the first layer 514 is exposed to an oxidizing gas composition 518, such as oxygen, to oxidize an upper portion of the first layer 514 and form a second layer 516 (e.g., second layer 118). For example, the second layer 516 can be aluminum oxide or niobium oxide. One or more oxide growth parameters are determined based on the measured/determined widths 508, 512 to set a thickness of the second layer 516. For example, pressures of one or more gases in the oxidizing gas composition 518, a duration of exposure to the oxidizing gas composition 518, and/or a temperature of the fabricated sample during oxidation can be controlled to set the thickness of the second layer. The thickness is set so that a Josephson junction that includes the first and second layers 514, 516 has target values for one or more parameters, such as $R_n$, $I_C$, L, and/or $f_{01}$.

In some implementations, the thickness may be very thin, e.g., on the order of nanometers, such that the thickness may be non-uniform across the second layer 516 and not well-defined as a single value. However, by tuning of the one or more oxide growth parameters, an average or aggregate thickness can be tuned to provide the target values. For example, an experimentally-derived curve can provide a relationship between one or more oxide growth parameters and $R_n$, $I_C$, L, and/or $f_{01}$. For example, the thickness can be tuned based on selection of oxide growth parameters without being itself known exactly or considered in the determination of the oxide growth parameters.

Instead of or in addition to formation of the second layer 516 by oxidation of the first layer 514, in some implementations the second layer 516 can be formed by another method, such as atomic layer deposition. The second layer 516 need not be an oxide but, rather, can be a nitride, a semiconductor, or another non-superconductor material suitable for forming a Josephson junction.

Figure 5D:
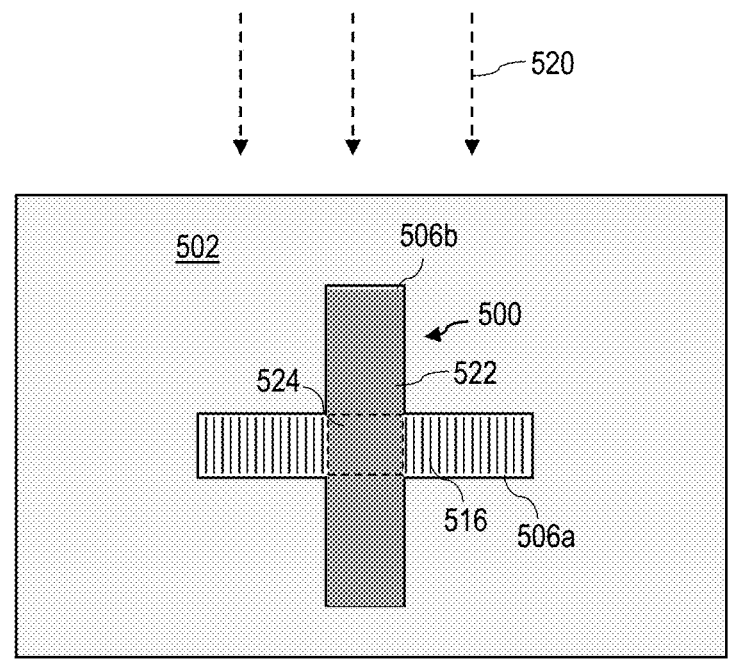

As shown in FIG. 5D, a third layer 522 (e.g., third layer 222) is deposited in the opening 500 by physical vapor deposition conducted at a second deposition angle that is different form the first deposition angle, indicated by deposition direction 520. Because of the aspect ratio of the opening 500 (e.g., because of a high ratio of a height of the photoresist sidewalls of the opening 500 to width 508), the third layer 522 is deposited in the second opening portion 506b and not in the first opening portion 506a (except for intersection areas of the two opening portions 506a, 506b). For example, the third layer 522 can be a metal superconductor material, such as aluminum, niobium, or tantalum. in some implementations, the third layer 522 is composed of the same material as the first layer 514, e.g., aluminum metal.

An overlap region 524 of the first layer 514 and the third layer 522 is a Josephson junction (e.g., is a superconductor/ non-superconductor/superconductor junction when cooled to an appropriate temperature). The area of the overlap region 524 is A, the junction area discussed above, and has value $A=a_1$[width 508]$\times a_2$[width 512]. $a_1$ and $a_2$ are coefficients reflecting the fact that material of the first and/or third layers 514, 522 may not be deposited across the entire widths of the opening portions 506a, 506; in some implementations, $a_1$ and/or $a_2$ are equal to 1. The area of the overlap region 524 is itself associated with the area of the opening 500, based on their related geometries. Accordingly, based on the measured or determined widths 508, 512, A can be determined, and a corresponding Josephson junction t of the second layer 516 can be set by appropriate selection of one or more oxide growth parameters, to provide desired values for $R_n$, $I_C$, L, and/or $f_{01}$, or another Josephson junction and/or qubit parameter.

In some implementations, one or more further processing steps are performed after deposition of the third layer 522. For example, a liftoff step, such as immersion in an appropriate solvent (e.g., acetone), can be performed to remove the photoresist mask layer 502 and, with the photoresist mask layer 502, material deposited on the photoresist mask layer 502 during deposition of the first and third layers 514, 522. In some implementations, further processing is performed to couple the first and third layers 514, 522 to corresponding traces/contacts, to couple the Josephson junction to one or more other components of a circuit. For example, the further processing can include photolithography and/or electron beam lithography to fabricate the traces/contacts.

Figure 6A:
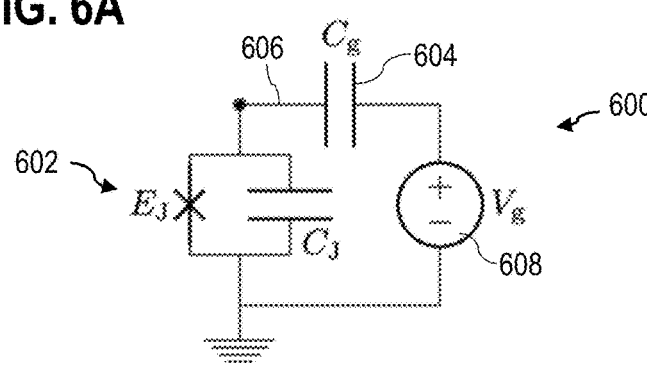
FIGS. 6A-6D are schematics illustrating examples of qubits.

For example, Josephson junctions fabricated according to implementations of this disclosure (having one or more fabrication parameters determined based on a measured feature size associated with an area of an opening) can be integrated into qubits. FIGS. 6A-6D illustrate various qubit types into which the Josephson junctions can be integrated. As shown in FIG. 6A, an example of a charge qubit 600 includes a Josephson junction 602 having Josephson energy $E_J$ and capacitance $C_J$. The Josephson junction 602 is coupled to a gate capacitance 604 ($C_g$), such as a parallel-plate capacitor or other capacitor, and to a voltage source 608 ($V_g$). Components of this and other described qubits can be coupled to one another by conducting or superconducting traces 606.

Figure 6B:
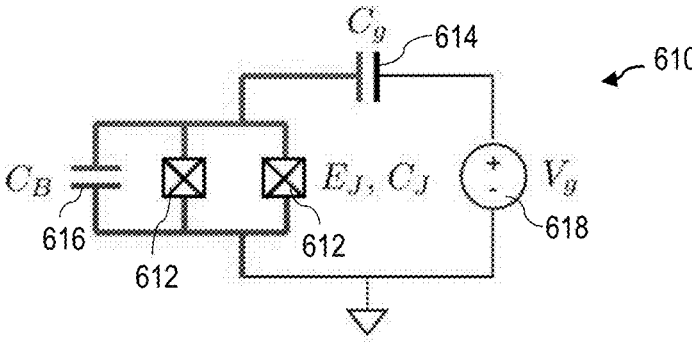

As shown in FIG. 6B, an example of a transmon qubit 610 includes two Josephson junctions 612 (having respective Josephson energies and capacitances), a gate capacitance 614, a voltage source 618, and a shunt capacitance 616 ($C_B$). The shunt capacitance 616 is configured to cause the ratio of the Josephson energy $E_J$ to a charging energy of the transmon qubit 610 to be small, decrease sensitivity to charge noise while maintaining sufficient anharmonicity for selective qubit control. Other transmon configurations (e.g., single-Josephson junction transmon configurations and/or configurations not having a voltage source) are also within the scope of this disclosure.

Figure 6C:
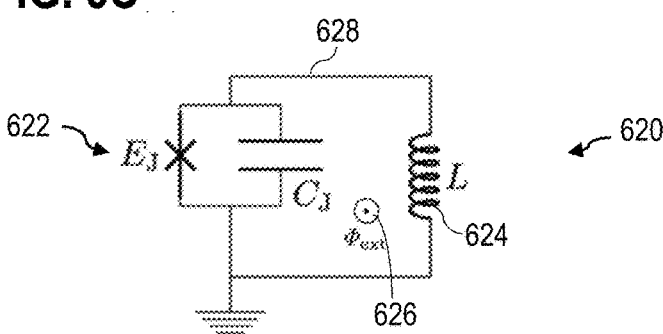

As shown in FIG. 6C, an example of a flux qubit 620 includes a Josephson junction 622 (e.g., as described for Josephson junction 602) and an inductance 624. An external magnetic flux 626 is applied through the loop 628 of the flux qubit 620.

Figure 6D:
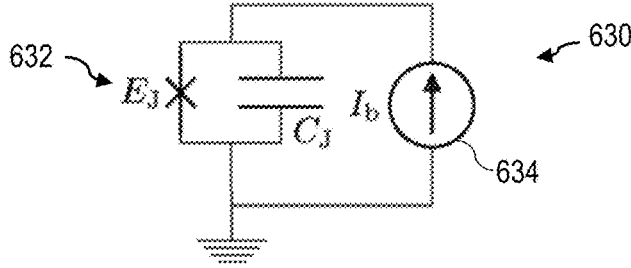

As shown in FIG. 6D, an example of a phase qubit 630 includes a Josephson junction 632 (e.g., as described for Josephson junction 602) and a current source 634.

Implementations of the present disclosure can be used to fabricate qubits having these and other circuit topologies/ configurations so that the qubits and/or one or more Josephson junctions of the qubits have one or more target parameters, such as $R_n$, $I_C$, L, charging energy $E_C$, Josephson energy $E_J$, and/or $f_{01}$. In some implementations, one or more of these and/or other target parameters is achieved by selecting an oxide growth parameter of an oxide layer of a Josephson junction based on a measured feature size. Accordingly, qubit operation can be improved by provision of qubits with more stable parameters across different fabrication iterations.

The qubits illustrated in FIGS. 6A-6D are examples; qubits within the scope of this disclosure can have other configurations, such as fewer components or additional components (e.g., more Josephson junctions than illustrated).

For Josephson junction implementations, feed-forward processes that modify oxide growth parameters for formation of the second layer 218 (an oxide), based on measurement of a feature size associated with a dimension of an opening, can be advantageous compared to other methods that may reduce Josephson junction parameter variation. As noted above, variation of the oxide parameters on a per-sample basis does not necessitate post-fabrication processing of the sample, but rather represents modification of an existing portion of the fabrication process. In addition, although some implementations described herein include a measurement process, the measurement process is conducted prior to forming the oxide layer of the Josephson junction, such that contamination associated with the measurement process can be reduced, e.g., by cleaning after measurement and/or because the measurement process does not affect the metal-oxide interface directly, because the interface has not been formed at the time of measurement. By contrast, some processes based on post-fabrication measurement (e.g., post-fabrication electrical measurements) can impair device performance by introducing contamination into already-fabricated devices.

In addition, for some implementations according to this disclosure, it has been recognized (i) that variations in dimensions of openings (associated with eventual Josephson junction area) can be an important source of variations in Josephson junction parameters, (ii) that measurements of feature sizes associated with the opening area can be performed during the Josephson junction fabrication process, and (iii) that oxide growth parameters can be varied based on the measured feature sizes. Based at least on these elements in combination, Josephson junction parameters can be targeted more reliably, improving qubit performance.

Figure 7:
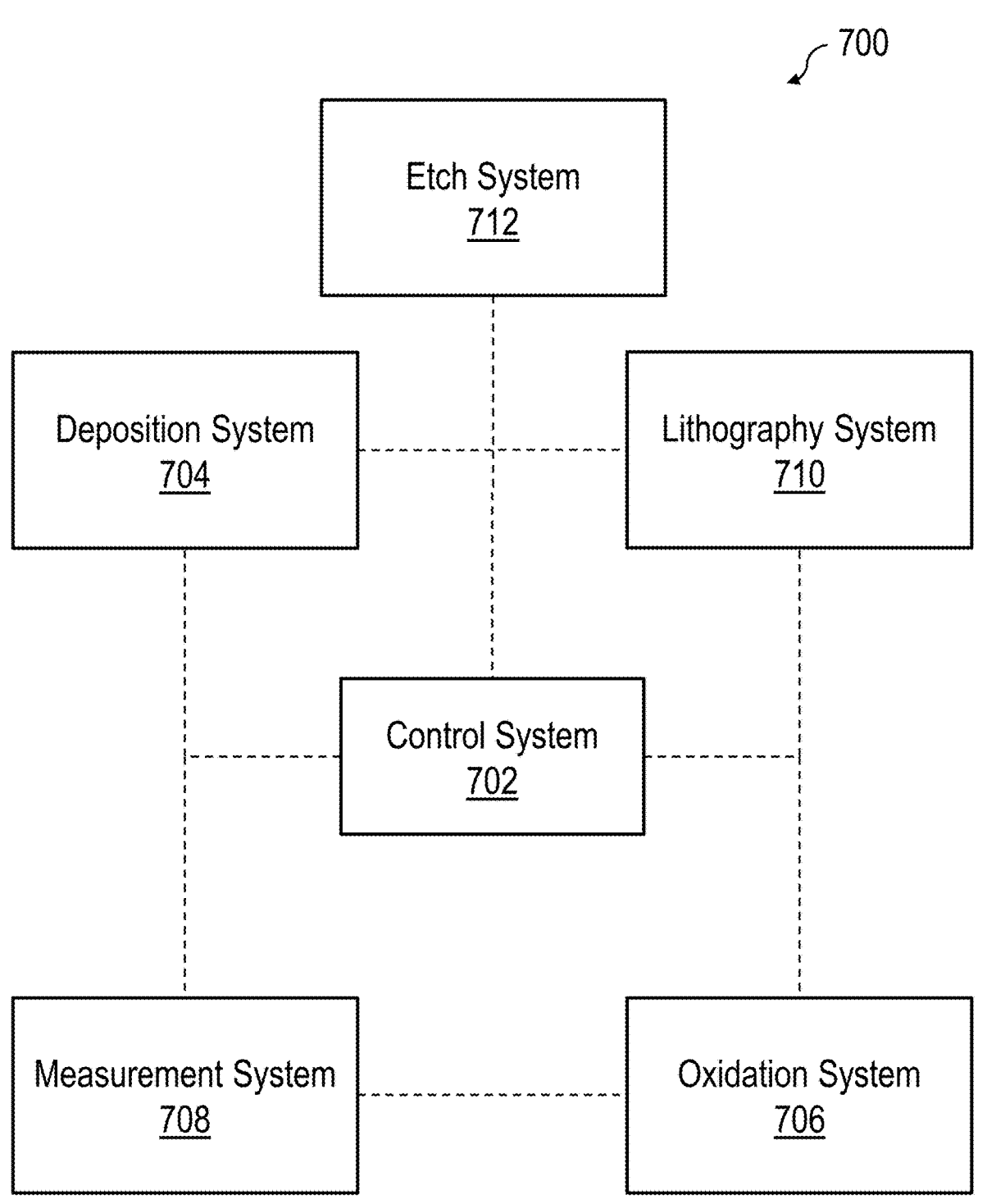
FIG. 7 is a schematic illustrating an example of a fabrication system.

FIG. 7 illustrates an example of a system 700 that can implement some processes according to this disclosure. The system 700 includes a control system 702, such as a computer system including one or more computers. The control system 702 can be local to other components of the system 700 and/or at least partially remote, e.g., a cloud-based or server-based control system. The control system 702 is communicatively coupled to a deposition system 704, an oxidation system 706, a measurement system 708, a lithography system 710, and an etch system 712.

The lithography system 710 can include one or more lithography tools/devices, such as a photolithography tool, an electron beam lithography tool, a resist deposition tool, a resist development tool, and/or a resist exposure tool. The lithography system 710 can be configured to form an opening in a mask layer and/or a calibration feature in the mask layer, such as by depositing resist onto a substrate, exposing the resist in a pattern corresponding to the opening and/or calibration feature, and developing the resist. In some implementations, the lithography system 710 can be configured to form one or more additional features (e.g., in the mask layer) based on one or more fabrication parameters determined based on a measured feature size. The control system 702 can be configured to cause the lithography system 710 to form the feature in the initial layer (e.g., an opening in a mask layer, a pad, a ridge, an array of features, etc.), a calibration feature, and/or the one or more additional features, e.g., by providing suitable commands to the lithography system 710.

The etch system 712 can include one or more material removal tools/devices, such as a wet chemical etching tool and/or a plasma etching tool. The etch system 712 can be configured to form the feature in the initial layer, a calibration feature, and/or one or more additional features based on one or more fabrication parameters determined based on a measured feature size. The control system 702 can be configured to cause the etch system 712 to form material removal processes, e.g., by providing suitable commands to the etch system 712.

The measurement system 708 can include one or more measurement devices as described above, e.g., an optical microscope, an electron microscope, and/or an atomic force microscope. The control system 702 is configured to cause the measurement system 708 to measure a feature size associated with an opening in a mask layer, e.g., by providing suitable commands to the measurement system 708. The control system 702 is configured to receive measurement results from the measurement system 708 and determine one or more fabrication parameters based on the measurement results.

The deposition system 704 includes one or more fabrication tools configured to form at least one of the first, second, or third layers 212, 216, 218, 222. For example, the deposition system 704 can include a chemical vapor deposition tool (e.g., a chamber having gas inlet(s) and connected to a pump) and/or a physical vapor deposition tool (e.g., a thermal evaporator, an electron-beam evaporator, or a sputterer). For example, the control system 702 can be configured to cause the deposition system 704 to form at least one of the first, second, or third layers 212, 216, 218, 222, e.g., by providing suitable commands to the deposition system 704. Layer(s) and feature(s) formed by the deposition system 704 can be formed using one or more fabrication parameters determined based on a measured feature size.

In some implementations in which at least one layer (e.g., the second layer 218) is an oxide, the system 700 includes an oxidation system 706 configured to form the oxide. The oxidation system 706 can include an oxidation chamber and associated gas management devices for providing an oxidizing gas into the oxidation chamber. In some implementations, the oxidation chamber is a chamber in which one or more deposition processes is conducted. For example, the deposition system 704 and the oxidation system 706 can share a common chamber in which both physical vapor deposition and oxidation are conducted; an oxidizing gas can be provided into the chamber after deposition of a first layer in order to oxidize the first layer (forming a second layer), and a third layer can then be deposited on the second layer in the chamber. The control system 702 is configured to cause the oxidation system 706 to form the oxide layer, e.g., by providing suitable commands to the oxidation system 706.

Some features described may be implemented in digital and/or analog electronic circuitry or in computer hardware, firmware, software, or in combinations of them, e.g., as the control system 702. Some features may be implemented in a computer program product tangibly embodied in an information carrier, e.g., in a machine-readable storage device (e.g., included in the control system 702), for execution by a programmable processor. Method steps may be performed by a programmable processor (e.g., included in the control system 702) executing a program of instructions to perform functions of the described implementations by operating on input data and generating output, by discrete circuitry (e.g., included in the control system 702) performing analog and/or digital circuit operations, or by a combination thereof.

Some described features may be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language (e.g., Objective-C, Java), including compiled or interpreted languages, and it may be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random-access memory or both. The essential elements of a computer are a processor for executing instructions and one or more memories for storing instructions and data. Generally, a computer may communicate with mass storage devices for storing data files. These mass storage devices may include magnetic disks, such as internal hard disks and removable disks; magneto-optical disks; and optical disks. Storage devices suitable for tangibly embodying computer program instructions and data include all forms of non-volatile memory, including by way of example, semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, ASICs (application-specific integrated circuits). To provide for interaction with a user the features may be implemented on a computer having a display device such as a CRT (cathode ray tube), LED (light emitting diode) or LCD (liquid crystal display) display or monitor for displaying information to the author, a keyboard and a pointing device, such as a mouse or a trackball by which the author may provide input to the computer.

A number of implementations have been described. Nevertheless, it will be understood that various modifications may be made. Elements of one or more implementations may be combined, deleted, modified, or supplemented to form further implementations. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method comprising:

forming an opening in a mask layer;

measuring a feature size associated with a dimension of the opening;

based on the feature size, determining a fabrication parameter; and forming a second layer in the opening, wherein forming the second layer is based on the fabrication parameter.

2. The method of claim 1, wherein the second layer comprises an oxide layer, and wherein the fabrication parameter comprises an oxide growth parameter.

3. The method of claim 2, wherein forming the second layer comprises:

forming a first layer in the opening; and forming the oxide layer on the first layer.

4. The method of claim 3, wherein forming the second layer comprises growing the oxide layer by oxidizing the first layer based on the oxide growth parameter.

5. The method of claim 3, wherein the first layer comprises a metal, and wherein the method comprises:

subsequent to forming the oxide layer, forming a third layer on the oxide layer to form a Josephson junction.

6. The method of claim 5, comprising forming a qubit that includes the Josephson junction.

7. The method of claim 5, wherein forming the first layer comprises depositing the first layer at a first deposition angle, and wherein forming the third layer comprises depositing the third layer at a second deposition angle that is different from the first deposition angle.

8. The method of claim 5, wherein the metal comprises a superconductor material.

9. The method of claim 2, wherein forming the second layer comprises exposing a first layer to an oxidizing gas at a partial pressure for a period of time, and wherein the oxide growth parameter comprises the partial pressure.

10. The method of claim 2, wherein forming the second layer comprises exposing a first layer to an oxidizing gas at a partial pressure for a period of time, and wherein the oxide growth parameter comprises the period of time.

11. The method of claim 1, further comprising forming a circuit element that includes the second layer and a first layer on which the second layer is disposed, wherein determining the fabrication parameter comprises:

obtaining a target resonance frequency of the circuit element or a target critical current of the circuit element;

determining a junction area based on the measured feature size; and based on the junction area, determining a value for the fabrication parameter that, when applied during formation of the second layer, causes the circuit element to exhibit the target resonance frequency or the target critical current.

12. The method of claim 11, wherein determining the fabrication parameter comprises:

obtaining a target thickness of the second layer that causes the circuit element to have the target resonance frequency or the target critical current; and determining a value of the fabrication parameter that causes the second layer to have the target thickness.

13. The method of claim 1, wherein measuring the feature size comprises measuring the dimension of the opening.

14. The method of claim 1, wherein measuring the feature size comprises measuring a dimension of a calibration structure defined by the mask layer, wherein the calibration structure is distinct from the opening.

15. The method of claim 1, wherein determining the fabrication parameter comprises:

determining that the feature size is larger than a predetermined feature size, and in response to determining that the feature size is larger than the predetermined feature size, selecting the fabrication parameter to cause a thickness of the second layer to be thicker than a first thickness associated with the predetermined feature size; or determining that the feature size is smaller than the predetermined feature size, and in response to determining that the feature size is smaller than the predetermined feature size, selecting the fabrication parameter to cause the thickness of the second layer to be thinner than the first thickness associated with the predetermined feature size.

16. The method of claim 1, wherein measuring the feature size comprises measuring the feature size using atomic force microscopy.

* * * * *